(12) United States Patent
Rooney et al.

(10) Patent No.: US 12,197,766 B2
(45) Date of Patent: Jan. 14, 2025

(54) ERROR INJECTION METHODS USING SOFT POST-PACKAGE REPAIR (sPPR) TECHNIQUES AND MEMORY DEVICES AND MEMORY SYSTEMS EMPLOYING THE SAME

(71) Applicant: Micron Technology, Inc., Boise, ID (US)

(72) Inventors: Randall J. Rooney, Boise, ID (US); Matthew A. Prather, Boise, ID (US); Neal J. Koyle, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 17/517,107

(22) Filed: Nov. 2, 2021

(65) Prior Publication Data

US 2022/0147267 A1  May 12, 2022

Related U.S. Application Data

(60) Provisional application No. 63/112,088, filed on Nov. 10, 2020.

(51) Int. Cl.
*G06F 11/08* (2006.01)
*G06F 3/06* (2006.01)
*G06F 11/10* (2006.01)
*G11C 29/00* (2006.01)

(52) U.S. Cl.
CPC .......... *G06F 3/0655* (2013.01); *G06F 3/0604* (2013.01); *G06F 11/1044* (2013.01); *G11C 29/76* (2013.01)

(58) Field of Classification Search
CPC ... G06F 11/1044; G06F 11/1048; G11C 29/76
See application file for complete search history.

(56) References Cited

U.S. PATENT DOCUMENTS

| 10,740,523 | B1 * | 8/2020 | Klein ................... G06F 30/34 |
| 2008/0010567 | A1 * | 1/2008 | Hughes ................. G11C 29/16 |
| | | | 714/E11.169 |

(Continued)

FOREIGN PATENT DOCUMENTS

WO   WO-2017030564 A1 *  2/2017  ............. G11C 29/10

*Primary Examiner* — Joseph O Schell
(74) *Attorney, Agent, or Firm* — Perkins Coie LLP

(57) ABSTRACT

Methods for operating a memory system are disclosed herein. In one embodiment, a method comprises receiving first data to be written at a logical address of a memory array, storing the first data at a first physical address corresponding to the logical address, and remapping the logical address to a second physical address, for example, using a soft post package repair operation. The method can further include receiving second data different from the first data to be written at the logical address, storing the second data at the second physical address, and remapping the logical address to the first physical address. In some embodiments, the method can comprise storing first and second ECC data corresponding to the first and second data, respectively. The method can further comprise outputting the first data and/or the second ECC data in response to a read request corresponding to the logical address.

26 Claims, 12 Drawing Sheets

(56) References Cited

U.S. PATENT DOCUMENTS

| | | | |
|---|---|---|---|
| 2014/0351629 A1* | 11/2014 | Ware | G06F 11/1068 |
| | | | 714/6.13 |
| 2017/0371560 A1* | 12/2017 | MacGarry | G06F 11/3037 |
| 2018/0174665 A1* | 6/2018 | Kraipak | G11C 29/36 |
| 2018/0275887 A1* | 9/2018 | Yang | G06F 12/1009 |
| 2018/0331692 A1* | 11/2018 | Gulati | H03M 13/015 |
| 2019/0108892 A1* | 4/2019 | Berke | G11C 29/886 |
| 2019/0188064 A1* | 6/2019 | Ciraula | G11C 29/4401 |
| 2020/0151070 A1* | 5/2020 | Lee | G06F 12/10 |
| 2021/0191829 A1* | 6/2021 | Muthiyalu | G11C 29/814 |
| 2023/0185659 A1* | 6/2023 | Bao | G06F 11/0793 |
| | | | 714/764 |

* cited by examiner

*Fig. 3A*

| LOGICAL ADDRESS | DRAM0 PHYSICAL ADDRESS | DRAM0 MEMORY ROW | DATA ON DRAM0 | CORRESPONDING ECC DATA |
|---|---|---|---|---|
| LA64K | PA64K | 64K | | |
| ⋮ | ⋮ | ⋮ | ⋮ | ⋮ |
| LA3 | PA3 | 3 | | |
| LA2 | PA2 | 2 | | |
| LA1 | PA1 | 1 | | |
| LA0 | PA0 | 0 | | |
| | PAR | R | | |

| LOGICAL ADDRESS | DRAM0 PHYSICAL ADDRESS | DRAM0 MEMORY ROW | DATA ON DRAM0 | CORRESPONDING ECC DATA |
|---|---|---|---|---|
| LA64K | PA64K | 64K | | |
| ⋮ | ⋮ | ⋮ | ⋮ | ⋮ |
| LA3 | PA3 | 3 | | |
| | PA2 | 2 | | X |
| LA1 | PA1 | 1 | | |
| LA0 | PA0 | 0 | | |
| LA2 | PAR | R | FIRST DATA | |

*Fig. 4C*

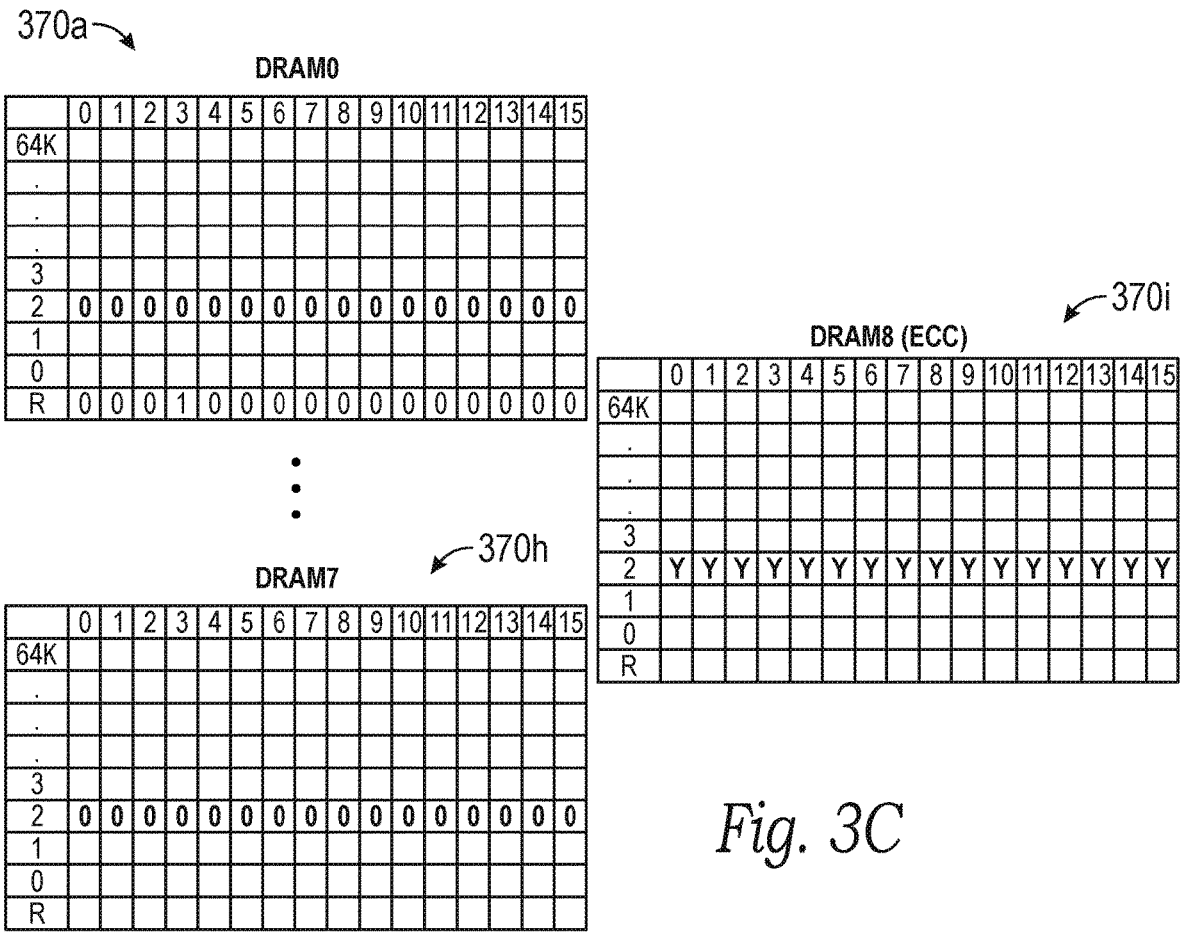

| LOGICAL ADDRESS | DRAM0 PHYSICAL ADDRESS | DRAM0 MEMORY ROW | DATA ON DRAM0 | CORRESPONDING ECC DATA |
|---|---|---|---|---|
| LA64K | PA64K | 64K | | |
| ⋮ | ⋮ | ⋮ | ⋮ | ⋮ |
| LA3 | PA3 | 3 | | |
| ~~LA2~~ | PA2 | 2 | | |
| LA1 | PA1 | 1 | | |
| LA0 | PA0 | 0 | | |
| LA2 | PAR | R | | |

| LOGICAL ADDRESS | DRAM0 PHYSICAL ADDRESS | DRAM0 MEMORY ROW | DATA ON DRAM0 | CORRESPONDING ECC DATA |
|---|---|---|---|---|
| LA64K | PA64K | 64K | | |
| ⋮ | ⋮ | ⋮ | ⋮ | ⋮ |
| LA3 | PA3 | 3 | | |
| LA2 | PA2 | 2 | | X |
| LA1 | PA1 | 1 | | |
| ~~LA0~~ | PA0 | 0 | | |
| ~~LA2~~ LA0 | PAR | R | FIRST DATA | |

Fig. 4D

| LOGICAL ADDRESS | DRAM0 PHYSICAL ADDRESS | DRAM0 MEMORY ROW | DATA ON DRAM0 | CORRESPONDING ECC DATA |
|---|---|---|---|---|
| LA64K | PA64K | 64K | | |
| ⋮ | ⋮ | ⋮ | ⋮ | ⋮ |
| LA3 | PA3 | 3 | | |
| ~~LA2~~ | PA2 | 2 | SECOND DATA | Y |
| LA1 | PA1 | 1 | | |
| LA0 | PA0 | 0 | | |
| ~~LA0~~ LA2 | PAR | R | FIRST DATA | |

ERROR INJECTION METHODS USING SOFT POST-PACKAGE REPAIR (sPPR) TECHNIQUES AND MEMORY DEVICES AND MEMORY SYSTEMS EMPLOYING THE SAME

CROSS-REFERENCE TO RELATED APPLICATION(S)

The present application claims priority to U.S. Provisional Patent Application No. 63/112,088, filed Nov. 10, 2020, the disclosure of which is incorporated herein by reference in its entirety.

TECHNICAL FIELD

The present disclosure is related to memory systems, devices, and associated methods. In particular, the present disclosure is related to error injection methods using soft post-package repair (sPPR) techniques and memory devices and memory systems employing the same.

BACKGROUND

Memory devices are widely used to store information related to various electronic devices such as computers, wireless communication devices, cameras, digital displays, and the like. Memory devices are frequently provided as internal, semiconductor, integrated circuits, and/or external removable devices in computers or other electronic devices. There are many different types of memory, including volatile and non-volatile memory. Volatile memory, including static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

FIGS. 3A-3C are various tables tracking data stored to memory arrays of a memory system in accordance with various embodiments of the present technology.

FIGS. 4A-4F illustrate various states of a table tracking sPPR operations, logical to physical address mappings, and data stored to memory arrays of a memory system in accordance with various embodiments of the present technology.

DETAILED DESCRIPTION

Figure 1A:
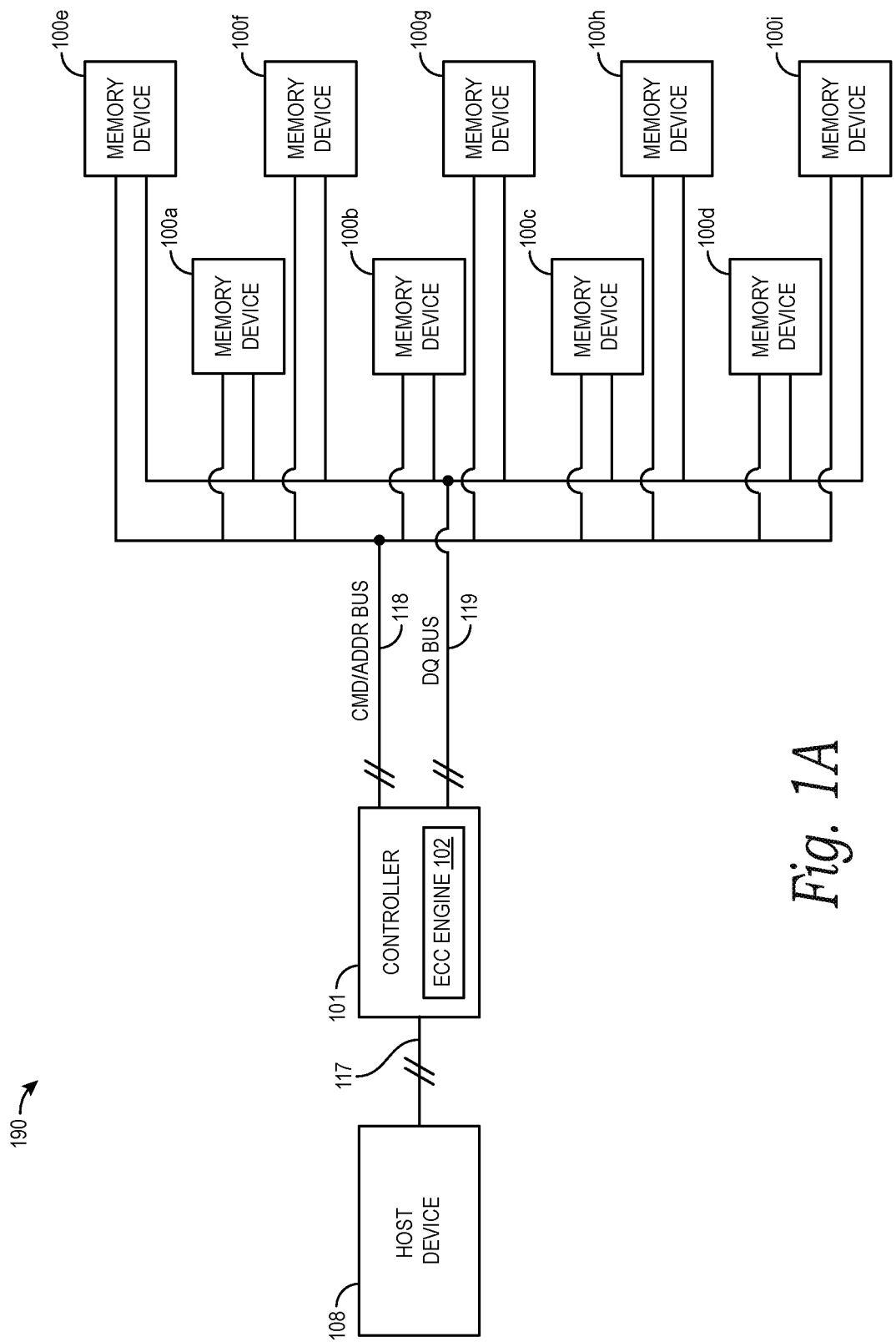
FIG. 1A is a block diagram schematically illustrating a memory system configured in accordance with various embodiments of the present technology.

As discussed in greater detail below, the technology disclosed herein relates to error injection methods using soft post-package repair (sPPR) techniques and associated memory systems, devices, and methods. In some embodiments, a method of the present technology includes receiving first data to be written at a logical address and storing the first data at a first physical address corresponding to the logical address. The first data can include bits that emulate a device defect (e.g., a single bit error, a double bit error, a wordline driver error, etc.). In other words, the first data can include one or more intentionally-injected errors with respect to second data that is devoid of the intentionally-injected errors. The method can further include remapping the logical address to a second physical address (e.g., using a first sPPR operation), receiving the second data to be written at the logical address, storing the second data at the second physical address, and remapping the logical address back to the first physical address (e.g., using a second sPPR operation). The method can additionally include, in response to a read request corresponding to the logical address, outputting the first data from the first physical address. In some embodiments, the method can also include (a) generating, storing, and/or outputting ECC information corresponding to the second data, and/or (b) using the first data and the ECC information to test the reliability, availability, and serviceability (RAS) or ECC capability of a memory device or memory system. A person skilled in the art will understand that the technology may have additional embodiments and that the technology may be practiced without several of the details of the embodiments described below with reference to FIGS. 1A-6.

In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

A. Overview

Semiconductor memory devices may store information in an array of memory cells. The information may be stored as a binary code, and each memory cell may store a bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column).

To address defects in a memory array, memory devices may be configured to carry out one or more types of post-package repair (PPR). For example, memory banks may generally include a number of additional rows of memory, which may generally be referred to as redundant rows. During a repair operation, a row address associated with a defective row may be redirected so that it is associated with one of the redundant rows instead. In some modes of operation, the repair operation may be a hard (or permanent) repair operation, in which updated row address information is stored in the memory in a non-volatile form (e.g., stored in a manner that is maintained even when the memory device is powered down). In other modes of operation, the repair operation may be a soft (or temporary) repair operation, in which (a) a set of volatile memory elements (such as latches, registers, and/or flip-flops) may be used to temporarily store updated addresses for a repair operation and (b) a decoder can map the defective addresses to another group of memory cells. The other group of memory cells can be a group of redundant memory cells (e.g., a row of redundant memory cells) that are dedicated to soft post package repair.

In accordance with one aspect of the present disclosure, the remapping capability of sPPR can be exploited to perform additional functions beyond the repair of defective memory cells. For example, in one embodiment of the present disclosure, errors can be injected into a memory device by remapping a logical address to which good data has been written to point to a different physical address to which known bad data has previously been written. Read requests directed to the remapped logical address will therefore output the known bad data, which can permit the testing and/or characterization of error detection and/or correction capability of the memory device and/or a memory system in which it is employed.

As memory cells scale to increase memory densities and storage capacities of memory devices, meeting various reliability criteria for the memory devices becomes ever more challenging. Error checking and correcting functions utilizing error correcting code (ECC) may help to circumvent certain reliability issues. In some embodiments, memory devices include an ECC circuit (which may be referred to as an ECC engine, module, block, or the like). For example, the ECC circuit included in the memory device ("on-die ECC circuit") may detect and correct at least one error (e.g., a valid logic state of "1" erroneously flipped to an invalid logic state of "0" or vice versa) in data. Additionally, or alternatively, the ECC circuit may detect two or more errors in the data. In some embodiments, a host device (e.g., a memory controller) coupled with the memory devices includes an ECC circuit external to the memory devices (e.g., system-level ECC functions). Being able to test the on-die ECC circuit and/or the system-level ECC functions would be desirable to confirm proper operations of the ECC circuits.

The on-die ECC circuits may be tested under manufacturing environments in various ways. For example, data may be written to a memory array with the on-die ECC circuit disabled (e.g., via test modes), and then read from the memory array with the ECC circuit enabled, or vice versa. In other examples, with the on-die ECC circuit enabled, valid data may be written to the memory array and then read back. Subsequently, poisoned data (e.g., one or more data bits intentionally inverted or flipped, one or more errors injected to the data) may be written and then read back to validate the on-die ECC circuit functionality. Once the memory devices are implemented in a system, however, accessing test modes and/or manipulating the data by injecting errors may not be available to the system (e.g., a host device, a memory controller) to test the on-die ECC functionality. Additionally, or alternatively, being able to provide poisoned data to the host device may be desirable to test the system-level ECC functionality.

Several embodiments of the present technology are directed to poisoning one or more bits of data (e.g., inverting, flipping, modifying, corrupting, or the like) within a memory device included in a system. Such poisoning of data may facilitate confirming functionality of the on-die ECC circuit and/or providing (outputting) poisoned data for testing the system-level ECC functionality. In this regard, the present technology allows a host device of the system, in conjunction with the memory device coupled therewith, to control which bits to invert (to poison) during write or read operations. In some embodiments, the host device may enable and utilize a sPPR function of the memory device to remap a logical address of a memory array between different physical addresses at which known-good and known-bad (e.g., poisoned) data are written, to permit the poisoning of data without reliance upon test modes or direct data manipulation.

B. Selected Embodiments of Memory Systems and Associated Devices and Methods

FIG. 1A is a block diagram schematically illustrating a memory system 190 (e.g., a dual in-line memory module (DIMM)) configured in accordance with various embodiments of the present technology. In the illustrated embodiment, the memory system 190 includes a module or rank of memory devices 100 (identified individually as memory devices 100a-100i in FIG. 1A), a controller 101, and a host device 108. In some embodiments, the memory devices 100 can be DRAM memory devices. Although illustrated with a single module/rank of nine memory devices 100 in FIG. 1A, the memory system 190 can include a greater or lesser number of memory devices 100 and/or memory modules/ranks in other embodiments of the present technology. Well-known components of the memory system 190 have been omitted from FIG. 1A and are not described in detail below so as to avoid unnecessarily obscuring aspects of the present technology.

The memory devices 100 can be connected to one or more electronic devices that are capable of utilizing memory for temporary or persistent storage of information, or a component thereof. For example, one or more of the memory devices 100 can be operably connected to one or more host devices. As a specific example, the memory devices 100 of the memory system 190 illustrated in FIG. 1A are connected to a host device 101 (hereinafter referred to as a "memory controller 101" or a "control circuit 101") and to a host device 108.

The memory devices 100 of FIG. 1A are operably connected to the memory controller 101 via a command/address (CMD/ADDR) bus 118 and a data (DQ) bus 119. As described in greater detail below with respect to FIG. 1B, the CMD/ADDR bus 118 and the DQ bus 119 can be used by the memory controller 101 to communicate commands, memory addresses, and/or data to the memory devices 100. In response, the memory devices 100 can execute commands received from the memory controller 101. For example, in the event a write command is received from the memory controller 101 over the CMD/ADDR bus 118, the memory devices 100 can receive data from the memory controller 101 over the data DQ bus 119 and can write the data to memory cells corresponding to memory addresses received from the memory controller 101 over the CMD/ADDR bus 118. As another example, in the event a read command is received from the memory controller 101 over the CMD/ADDR bus 118, the memory devices 100 can output data to the memory controller 101 over the data DQ bus 119 from memory cells corresponding to memory addresses received from the memory controller 101 over the CMD/ADDR bus 118.

The host device 108 of FIG. 1A may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.); a recorder of digital images, audio, and/or video; a vehicle; an appliance; a toy; or any one of a number of other products. In one embodiment, the host device 108 may be connected directly to one or more of the memory devices 100 (e.g., via a communications bus of signal traces (not shown)). Additionally, or alternatively, the host device 108 may be indirectly connected to one or more of the memory device 100 (e.g., over a networked connection or through intermediary devices, such as through the memory controller 101 and/or via a communications bus 117 of signal traces).

In some embodiments, the memory system 190 can include one or more RAS features, such as ECC components. For example, as shown in FIG. 1A, the memory controller 101 of the memory system 190 can include a system-level ECC component 102, such as an ECC engine or circuit. In these and other embodiments, the host device 108 can include a system-level ECC component in addition to or in lieu of the ECC component 102.

The ECC component 102 can be configured to generate ECC information based at least in part on (a) data to be written to one or more of the memory devices 100 and/or (b) data read from the one or more memory devices 100. The ECC information can include parity bits or other data (e.g., single-bit error correction and double-bit error detection codes) that can be used to identify and/or correct errors (e.g., bit insertions, bit deletions, or a bit inversions/flips) in data written to or read from the memory devices 100. In some embodiments, the ECC component 102 calculates or generates ECC information when the memory controller 101 writes data to one or more memory devices 100 of the memory system 190. The generated ECC information can be written to the memory devices 100 in addition to the corresponding write data. For example, the generated ECC information can be stored in the same memory devices 100 to which the memory controller 101 writes the corresponding data. In these and other embodiments, the generated ECC information can be stored in a different memory device 100 than the memory device(s) 100 to which the memory controller 101 writes the corresponding data. For example, eight of the memory devices 100 (e.g., the memory devices 100a-100h) can be used to store data (e.g., user data), and the ninth memory device 100 (e.g., the memory device 100i) can be used to store ECC information corresponding to the data stored in the other eight memory devices 100.

The ECC information can be used to identify and/or correct errors in data written to or read from the memory devices 100 during subsequent read operations. In particular, as the memory controller 101 reads the data from the memory devices 100, the memory controller 101 can also retrieve the ECC information corresponding to the data. Upon receipt of the data from the memory devices 100, the ECC component 102 can (a) recalculate or regenerate the ECC information based on the read data and (b) compare the recalculated ECC information to the retrieved ECC information that was stored in the memory devices 100 and calculated at the time the data was written to the memory devices 100. If the recalculated ECC information matches the retrieved ECC information, then the ECC component 102 can determine that there are no errors present in the corresponding data read from the memory devices 100. On the other hand, if the recalculated ECC information does not match the retrieved ECC information, the ECC component 102 (i) can determine that at least one error is present in the corresponding data read from the memory devices 100, and/or (ii) can use the recalculated ECC information and/or the retrieved ECC information to correct one or more of the errors.

As discussed in greater detail below with respect to FIG. 1B, one or more of the memory devices 100 of the memory system 190 can include device- or die-level ECC components (not shown in FIG. 1A) in addition to or in lieu of the system-level ECC component 102. In embodiments including both the system-level ECC component 102 and a die-level ECC component on a memory device 100, the ECC component 102 and the die-level ECC component can operate in tandem. For example, when the memory controller 101 writes data to the memory device 100, the memory controller 101 can supply the memory device 100 with ECC calculated by the ECC component 102. The die-level ECC component included within the memory device 100 can (a) separately calculate ECC information corresponding to the data received from the memory controller 101 and (b) compare the ECC information calculated by the die-level ECC component to the ECC information calculated by the ECC component 102. If the two sets of ECC information match, then the die-level ECC component can determine that there are no errors present in the corresponding data received from the memory controller 101. On the other hand, if the two sets of ECC information do not match, then the die-level ECC component can (i) determine that at least one error is present in the corresponding data received from the memory controller 101, and/or (ii) can use one or both of the sets of ECC information to correct one or more of the errors before writing the data to a memory array of the memory device 100.

As another example, when the memory controller 101 reads data from a memory device 100, the die-level ECC component included in the memory device 100 can calculate ECC information corresponding to the read data and supply the ECC information to the memory controller 101 along with the read data. In turn, the ECC component 102 can (a) separately calculate ECC information corresponding to the data received from the memory device 100 and (b) compare the ECC information calculated by the ECC component 102 to the ECC information calculated by the die-level ECC component. If the two sets of ECC information match, then the ECC component 102 can determine that there are no errors present in the corresponding data received from the memory device 100. On the other hand, if the two sets of ECC information do not match, then the ECC component 102 (i) can determine that at least one error is present in the corresponding data received from the memory device 100, and/or (ii) can use one or both of the sets of ECC information to correct one or more of the errors in the read data (e.g., before supplying the read data to the host device 108).

Figure 1B:
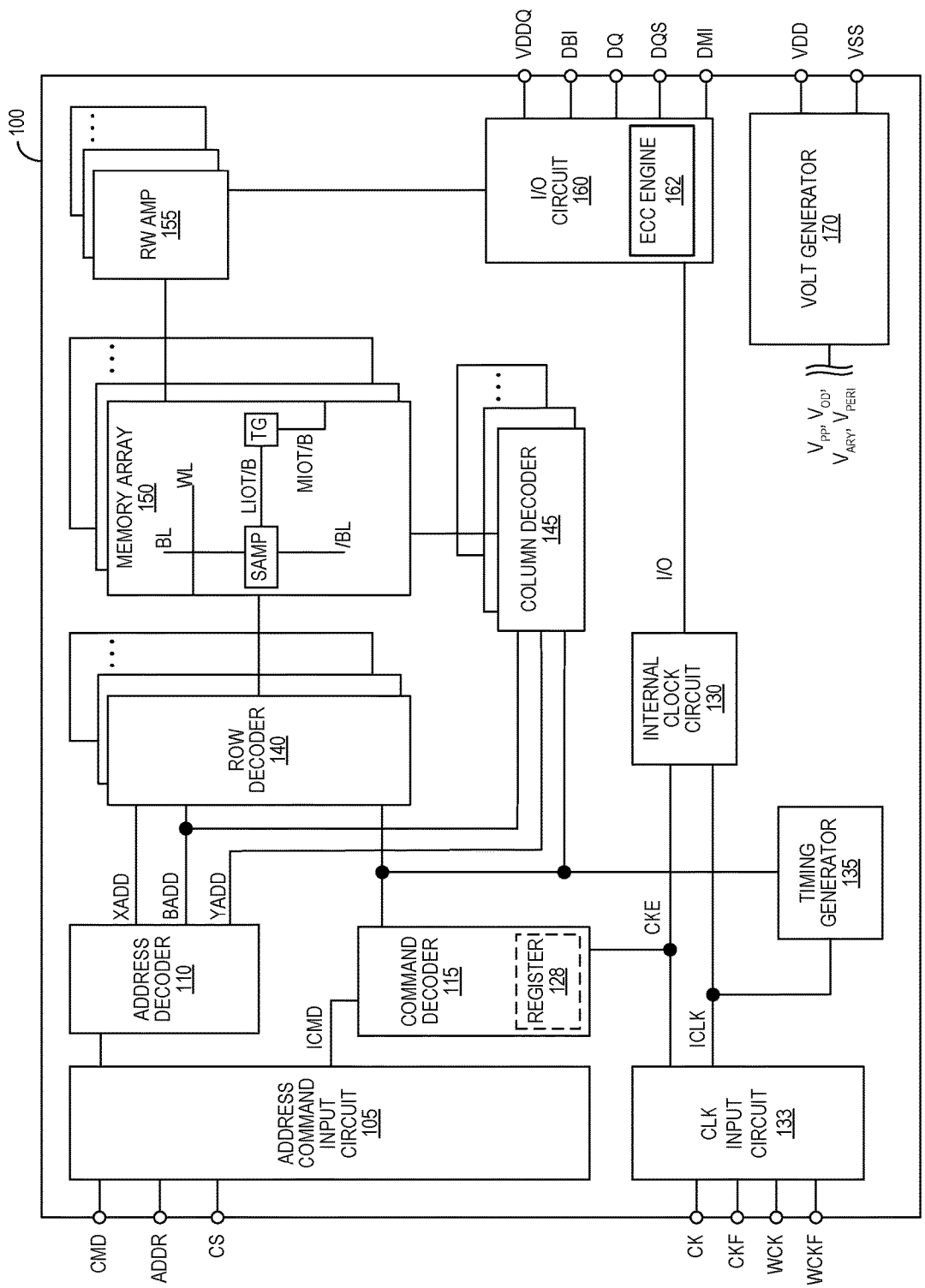
FIG. 1B is a block diagram schematically illustrating a memory device configured in accordance with various embodiments of the present technology.

FIG. 1B is a block diagram schematically illustrating a memory device 100 configured in accordance with various embodiments of the present technology. The memory device 100 may include an array of memory cells, such as memory array 150. The memory array 150 may include a plurality of banks (e.g., banks 0-15 in the example of FIG. 1B), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). Each word line of the plurality may be coupled with a corresponding word line driver (WL driver) configured to control a voltage of the word line during memory operations.

Memory cells can include any one of a number of different memory media types, including capacitive, phase change, magnetoresistive, ferroelectric, or the like. In some embodiments, a portion of the memory array 150 may be configured to store ECC information, such as ECC parity bits (ECC check bits) or codes. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus (e.g., the CMD/ADDR bus 118 of FIG. 1A) to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, and VDDQ.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminals may also be supplied with power supply potential VDDQ. The power supply potential VDDQ can be supplied to the input/output circuit 160 together with the power supply potential VSS. The power supply potential VDDQ can be the same potential as the power supply potential VDD in some embodiments of the present technology. The power supply potential VDDQ can be a different potential from the power supply potential VDD in other embodiments of the present technology. The dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 133. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 133 can receive the external clock signals. For example, when enabled by a CKE signal from the command decoder 115, an input buffer can receive the CK and CKF signals and the WCK and WCKF signals. The clock input circuit 133 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115.

For example, the internal clock circuit 130 can include a clock path (not shown in FIG. 1B) that receives the internal clock signal ICLK and provides various clock signals to the command decoder 115. The internal clock circuit 130 can further provide input/output (I/O) clock signals. The I/O clock signals can be supplied to an input/output circuit 160 and can be used as a timing signal for determining an output timing of read data and the input timing of write data. The I/O clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The command terminals and address terminals may be supplied with an address signal and a bank address signal from outside the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140 (which may be referred to as a row driver), and a decoded column address signal (YADD) to the column decoder 145 (which may be referred to as a column driver). The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., refresh commands, activate commands, precharge commands, access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. Other examples of memory operations that the memory device 100 may perform based on decoding the internal command signals ICMD includes a refresh command (e.g., re-establishing full charges stored in individual memory cells of the memory array 150), an activate command (e.g., activating a row in a particular bank, in some cases for subsequent access operations), or a precharge command (e.g., deactivating the activated row in the particular bank). The internal command signals can also include output and input activation commands, such as clocked command CMDCK (not shown in FIG. 1B).

The command decoder 115, in some embodiments, may further include one or more registers 128 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, the registers 128 (or a subset of the registers 128) may be referred to as mode registers. Additionally, or alternatively, the memory device 100 may include registers 128 as a separate component outside of the command decoder 115. In some embodiments, the registers 128 may include multi-purpose registers (MPRs) configured to write and/or read specialized data to and/or from the memory device 100.

When a read command is issued to a bank with an open row and a column address is timely supplied as part of the read command, read data can be read from memory cells in the memory array 150 designated by the row address (which may have been provided as part of the activate command identifying the open row) and column address. The read command may be received by the command decoder 115, which can provide internal commands to an input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., one or more of the registers 128). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in a mode register (e.g., one or more of the registers 128). The write latency WL information can be defined in terms of clock cycles of the CK clock signal. For example, the write latency information WL can be a number of clock cycles of the CK signal after the write command is received by the memory device 100 when the associated write data is received.

As discussed above, the memory device 100 can include one or more RAS features, such as ECC components. For example, as shown in FIG. 1B, the input/output circuit 160 includes a die-level ECC component 162, such as an ECC engine or circuit. The memory device 100 can include the ECC component 162 in addition to or in lieu of a system-level ECC component (e.g., the ECC component 102 of FIG. 1A). Although shown with the ECC component 162 as part of the input/output circuit 160 in FIG. 1B, the memory device 100 may include the ECC component 162 as a separate component outside of the input/output circuit 160 in other embodiments.

Similar to the ECC component 102 of FIG. 1A, the ECC component 162 of FIG. 1B can be configured to generate ECC information based at least in part on (a) data to be written to the memory array 150 of the memory devices 100 and/or (b) data read from the memory array 150 of the memory device 100. The ECC information calculated by the ECC component 162 can include parity bits or other data (e.g., single-bit error correction and double-bit error detection codes) that can be used to identify and/or correct errors (e.g., bit insertions, bit deletions, or a bit inversions/flips) in data written to or read from the memory array 150. In some embodiments, the ECC component 162 calculates or generates ECC information when the memory device 100 receives data to be written to the memory array 150. The generated ECC information can be written to the memory array 150 (e.g., to a portion of the memory array 150 configured to store ECC information) in addition to the corresponding write data.

The ECC information can be used to identify and/or correct errors in data written to or read from the memory array 150 during subsequent read operations. In particular, as data is read from the memory array 150, the memory device 100 can also retrieve the ECC information corresponding to the read data. Upon receipt of the read data, the ECC component 162 can (a) recalculate or regenerate the ECC information based on the read data and (b) compare the recalculated ECC information to the retrieved ECC information that was stored in the memory array 150 and calculated at the time the data was written to the memory array 150. If the recalculated ECC information matches the retrieved ECC information, then the ECC component 162 can determine that there are no errors present in the corresponding data read from the memory array 150. On the other hand, if the recalculated ECC information does not match the retrieved ECC information, the ECC component 102 (*i*) can determine that at least one error is present in the corresponding data read from the memory array 150, and/or (ii) can use the recalculated ECC information and/or the retrieved ECC information to correct one or more of the errors (e.g., before transmitting the data to the memory controller 101 and/or the host device 108 of FIG. 1A).

Additionally, or alternatively, the ECC component 162 can be operated in tandem with the system-level ECC component 102 of FIG. 1A, as discussed above. For example, when the ECC component 162 receives data to be written to the memory array 150 along with ECC information calculated by the ECC component 102, the ECC component 162 can (a) separately calculate ECC information corresponding to the received data and (b) compare the ECC information calculated by the ECC component 162 to the ECC information calculated by the ECC component 102 to determine whether errors are present in the corresponding data received from the memory controller 101. If errors are present, the ECC component 162 can use one or both of the sets of ECC information to correct one or more of the errors before writing the received data to the memory array 150.

As another example, the ECC component 162 can calculate ECC information for data read from the memory array 150. The read data and the corresponding ECC information calculated by the ECC component 162 can be transmitted to memory controller 101 of FIG. 1A. In turn, the system-level ECC component 102 can (a) separately calculate ECC information corresponding to the read data and (b) compare the ECC information calculated by the ECC component 102 to the ECC information calculated by the ECC component 162 to determine whether errors are present in the corresponding data received from the memory device 100. If errors are present, the ECC component 102 can use one or both of the sets of ECC information to correct one or more of the errors (e.g., before transmitting the read data to the host device 108).

As discussed above, the memory array 150 may include a number of redundant memory rows (e.g., per memory bank). The redundant memory rows can be used to perform repair operations on failing memory cells and/or memory rows of the memory array 150. In particular, a logical row address associated with a memory row of the memory array 150 including defective memory cells can be remapped to a redundant memory row of the memory array 150 as part of a PPR procedure. In some modes of operation, the repair operation may be a hard (or permanent) repair operation, in which the remapping of the logical address to the redundant memory row is stored in the memory device 100 and/or in the memory system 190 in a non-volatile form (e.g., stored in a manner that is maintained even when the memory device 100 and/or the memory system 190 is powered down). In other modes of operation, the repair operation may be a soft (or temporary) repair operation, in which (a) a set of volatile memory elements (such as latches, registers, and/or flip-flops) may be used to temporarily store updated addresses for a repair operation and (b) a decoder can map the defective addresses to another group of memory cells. The other group of memory cells can be a group of redundant memory cells (e.g., a row of redundant memory cells) that are dedicated to soft post package repair (sPPR).

As discussed in greater detail below with respect to FIGS. 2A-5, the remapping capability of sPPR can be exploited to perform additional functions beyond the repair of defective memory cells. For example, known errors (e.g., poisoned bits of data) can be injected into the memory array 150 of the memory device 100 by remapping a logical address to which known 'good data' has been written to point to a different physical address of the memory array 150 to which known 'bad data' has previously been written. Read requests directed to the remapped logical address will therefore output the known 'bad data,' which can permit the testing and/or characterization of error detection and/or correction capability of the memory device 100 and/or the memory system 190 (e.g., of the ECC component 102 of FIG. 1A and/or the ECC component 162 of FIG. 1B).

Figure 2A:
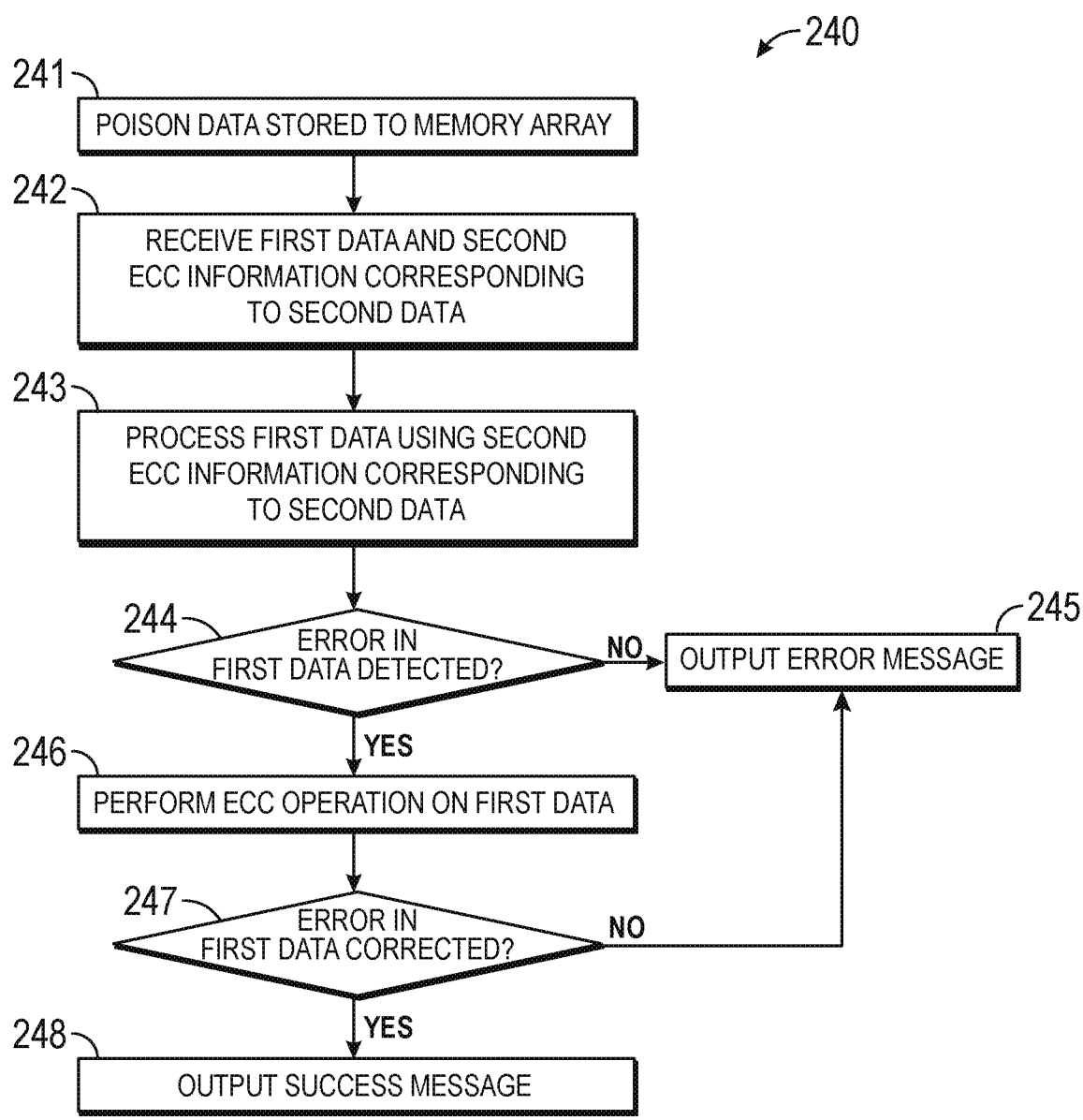
FIG. 2A is a flow diagram illustrating a method of analyzing error correction capability in accordance with various embodiments of the present technology.

FIG. 2A is a flow diagram illustrating a method 240 of analyzing error correction capability of a memory device and/or a memory system in accordance with various embodiments of the present technology. The method 240 is illustrated as a set of steps or blocks 241-248. All or a subset of one or more of the blocks 241-248 can be executed by components or devices of a memory system, such as the memory system 190 of FIG. 1A. For example, all or a subset of one or more of the blocks 241-248 can be executed by (i) one or more memory devices (e.g., one or more of the memory devices 100 of FIGS. 1A and 1B), (ii) a memory controller (e.g., the memory controller 101 of FIG. 1A), and/or (iii) a host device (e.g., the host device 108 of FIG. 1A). Furthermore, any one or more of the blocks 241-248 can be executed in accordance with the discussion of FIGS. 1A and 1B above.

The method 240 begins at block 241 by poisoning data stored to a memory array of a memory device. In some embodiments, poisoning data includes issuing or receiving one or more commands to poison the data. The commands can include one or more commands to enable an sPPR mode of a memory device, one or more commands to execute an sPPR operation, one or more commands to execute a write operation, one or more commands to execute a read operation, and/or one or more commands to disable or undo an sPPR operation. In these and other embodiments, poisoning the data stored to a memory array can include injecting known errors (e.g., known bit inversions, known bit deletions, and/or known bit insertions) into the memory array (e.g., by executing one or more sPPR operations and write operations).

Figure 2B:
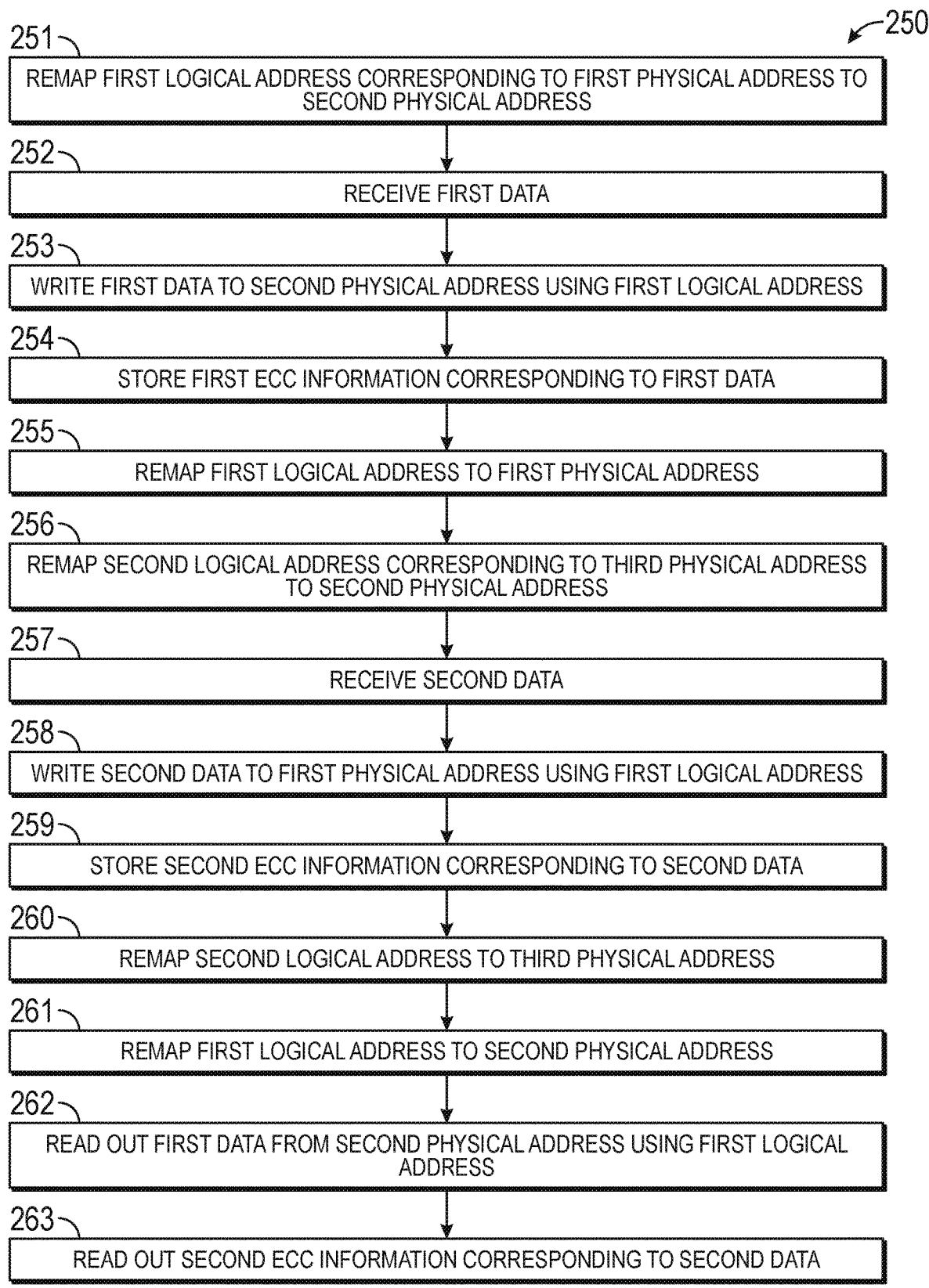
FIG. 2B is a flow diagram illustrating a method of injecting errors into a memory array using soft post-package repair and outputting the errors in accordance with various embodiments of the present technology.

FIG. 2B is a flow diagram illustrating a method 250 of injecting errors into a memory array using soft post-package repair operations and outputting the errors in accordance with various embodiments of the present technology. The method 250 is illustrated as a set of steps or blocks 251-263. All or a subset of one or more of the blocks 251-263 can be executed by components or devices of a memory system, such as the memory system 190 of FIG. 1A. For example, all or a subset of one or more of the blocks 251-263 can be executed by (i) one or more memory devices (e.g., one or more of the memory devices 100 of FIGS. 1A and 1B), (ii) a memory controller (e.g., the memory controller 101 of FIG. 1A), and/or (iii) a host device (e.g., the host device 108 of FIG. 1A).

The method 250 is discussed in detail below with repeated reference to FIGS. 3A-4F for the sake of clarity and understanding. FIGS. 3A-3C are various tables 370a, 370h, and 370i tracking data (e.g., user data and/or ECC data) stored in memory arrays of nine memory devices DRAM0-DRAM8 of a memory system in accordance with various embodiments of the present technology. For example, the table 370a of FIG. 3A tracks data (e.g., user data) stored in a memory array of a first memory device DRAM0 (e.g., the memory device 100a of the memory system 190 of FIG. 1A). As shown, the table 370a tracks 64,000 memory rows and 15 memory columns of the memory array of the first memory device DRAM0. The table 370a additionally tracks a redundant memory row R that can be used for sPPR operations.

A similar table can be maintained for each of the other memory devices of the memory system. For example, the table 370h of FIG. 3A illustrates is similar to the table 370a but corresponds to an eighth memory device DRAM8 (e.g., the memory device 100h of FIG. 1A). The table 370h can be representative of data (e.g., user data) stored to each of the other memory devices DRAM1-DRAM6. Thus, tables 370b-370g are omitted from FIGS. 3A-3C.

The table 370i of FIG. 3A is also similar to the tables 370a and 370h but corresponds to the ninth memory device DRAM8 (e.g., the memory device 100i of FIG. 1A) and is used to store ECC information (a) that is calculated by a system-level ECC component (e.g., the ECC component 102 of FIG. 1A) or one or more on-die ECC components of the memory devices DRAM0-DRAM8, and (b) that corresponds to data written to the other eight memory devices DRAM0-DRAM7 of the memory system (e.g., the memory devices 100a-100h of the memory system 190 of FIG. 1A).

FIGS. 4A-4F illustrate various states of a table 480 that corresponds to the tables 370a and 370i of FIGS. 3A-3C. The table 480 tracks mappings of logical memory row addresses (e.g., used by a memory controller and/or a host device of a memory system) to physical memory row addresses (e.g., native memory row addresses) used by the memory device DRAM0. For example, the physical address PA2 in the table 480 corresponds to memory row 2 in the table 480 and in the table 370a of FIG. 3A. As another example, the physical address PAR in the table 480 corresponds to the redundant memory row R in the table 480 and in the table 370a. The table 480 of FIGS. 4A-4F additionally tracks a general indication of data written to memory rows of the first memory device DRAM0, as well as a general indication of ECC information that is stored to memory rows of the ninth memory device DRAMS.

Referring to FIG. 2B, the method 250 begins at block 251 by remapping a first logical address from a first physical address to a second physical address of the memory device. In some embodiments, the remapping is performed in response to a command to enable and/or execute an sPPR operation on the memory device. In these and other embodiments, the first physical address can correspond to a first memory row of a memory array of the memory device, and the second physical address can correspond to a second memory row of the memory array.

The remapping performed at block 251 of the method 250 is shown in FIG. 4B for the sake of example. In particular, the first logical address referenced at block 251 above can be the logical address LA2 in the table 480 of FIG. 4B, the first physical address referenced at block 251 above can be the physical address PA2 in the table 480, and the second physical address referenced at block 251 above can be the physical address PAR in the table 480. Thus, the first physical address referenced at block 251 above can correspond to memory row 2 of the first memory device DRAM0 illustrated in the table 480 (and in the table 370a of FIG. 3A), and the second physical address referenced at block 251 above can correspond to the redundant memory row R of the first memory device DRAM0 illustrated in the table 480 (and in the table 370a of FIG. 3A).

Continuing with this example, the logical address LA2 (the first logical address) in the table 480 can be remapped at block 251 of the method 250 of FIG. 2B (e.g., as part of an sPPR operation) such that it corresponds to the physical address PAR (the second physical address) of the first memory device DRAM0 in the table 480 rather than the physical address PA2 (the first physical address) of the first memory device DRAM0 in the table 480. Thus, after the remapping performed at block 251 of FIG. 2B, the memory device DRAM0 accesses the redundant memory row R reflected in the tables 480 and 370a (FIG. 3A) as opposed to the memory row 2 reflected in the tables 480 and 370a when a memory controller or a host device references the logical address LA2 of the memory device DRAM0. The discussion below assumes that the logical address LA2 has been remapped to the second physical address for only the first memory device DRAM0. Thus, when the memory controller or the host device references the logical address LA2, the memory devices DRAM1-DRAM8 can continue to access the first physical address corresponding to memory row 2 of their respective memory arrays.

At blocks 252 and 253 of FIG. 2B, the method 250 continues by receiving first data and writing the first data to the memory array of one or more memory devices at the first logical address. In some embodiments, the first data can be written to the memory array of only one memory device (e.g., only the first memory device DRAM0 of FIGS. 3A-4F). In other embodiments, the first data can be written to the memory arrays of more than one memory device (e.g., all or a subset of the memory devices DRAM0-DRAM7 of FIGS. 3A-4F). As discussed in greater detail below, the first data can correspond to second data written to the memory array(s) before, during, or after the first data is written to the memory array(s). In these and other embodiments, the first data can be known 'bad data.' For example, the first data can include 'poisoned' bits of data that emulate one or more known errors (e.g., bit insertions, bit deletions, and/or bit inversions) with respect to second data. In other words, the first data can include one or more intentionally-injected errors relative to the second data.

The receiving and writing of first data performed at blocks 252 and 253 of the method 250 is shown in FIGS. 3B and 4C. Referring to FIG. 3B, the first data can be (a) received by each of the memory devices DRAM0-DRAM7 and (b) written to the respective memory arrays of the memory devices DRAM0-DRAM7 using the logical address LA2 (the first logical address). In particular, as shown in FIG. 4C, the logical address LA2 references the redundant memory row R in the memory array of the memory device DRAM0 due to the remapping performed at block 251 of the method 250 above. Thus, the memory device DRAM0 writes the first data to the redundant memory row R. In contrast, the logical address LA2 references memory row 2 in the memory array of each of the memory devices DRAM1-DRAM7. Therefore, the memory devices DRAM1-DRAM7 write the first data to memory row 2 of their memory arrays. The table 480 in FIG. 4C has been updated to include a general indication that first data is written to the redundant memory row R (corresponding to physical address PAR, or the second physical address) of the first memory device DRAM0.

In some embodiments, the first data can be received by one or more of the memory devices DRAM0-DRAM7 via one or more of their respective DQ terminals. For example, the memory devices DRAM0-DRAM7 can each include four DQ terminals DQ0-DQ3 and can receive the first data via only the first DQ terminal DQ0. Thus, the methods 240 (FIG. 2A) and 250 (FIG. 2B) can be used to test the ECC capability of the memory devices DRAM0-DRAM7 and/or of the corresponding memory system with respect to only the first DQ terminals DQ0 of one or more of the memory devices DRAM0-DRAM7. In other examples of the present technology, any combination of DQ terminals can be used to receive the first data. Thus, any combination of DQ terminals can be used to test the ECC capability of the memory devices DRAM0-DRAM7 and/or of the corresponding memory system.

As shown in FIG. 3B, the first data is primarily a string of "0" (e.g., logical low) data bits with one exception: the data bit received on the first memory device DRAM0 and stored at bit 3 of the redundant memory row R in the table 370a is a "1" (e.g., logical high) data bit. As discussed in greater detail below, the first data can correspond to second data that contains a string of all "0" data bits. Stated another way, the "1" data bit of the first data written to bit 3 of the redundant memory row R of the first memory device DRAM0 at block 253 of the method 250 (FIG. 2B) can be a single bit error with respect to the second data that has been intentionally injected into the memory array of the first memory device DRAM0 at a known location.

Referring back to FIG. 2B, the method 250 continues at block 254 by storing first ECC information corresponding to the first data. As discussed above with respect to FIG. 1A, the first ECC information (a) can be calculated by a system-level ECC component (e.g., the ECC component 102 of FIG. 1A) and/or by one or more on-die ECC components (e.g., one or more ECC components 162 of FIG. 1B), and (b) can include parity bits or other data (e.g., single-bit error correction and double-bit error detection codes) that can be used to identify and/or correct errors (e.g., bit insertions, bit deletions, or a bit inversions/flips) in the first data. In some embodiments, the first ECC information can be stored to the same memory device(s) storing the first data. In these and other embodiments, the first ECC information can be stored to a memory device dedicated to storing ECC information. For example, first ECC information "X" corresponding to the first data can be stored on the ninth memory device DRAM8 at memory row 2 (as shown in the table 370i of FIG. 3B) that corresponds to the first logical address (logical address LA2) and physical address PA2 on the ninth memory device DRAM8 (as shown in the table 480 of FIG. 4C).

In some embodiments, the first ECC information can be (a) calculated by a system-level ECC component and/or (b) received by one or more of the memory devices DRAM0-DRAM8 before, during, or after one or more of the memory devices DRAM0-DRAM8 receive the first data. In these and other embodiments, one or more of the memory devices DRAM0-DRAM8 can receive the first data and can use one or more on-die ECC components to calculate the first ECC information based at least in part on the first data. The memory devices DRAM0-DRAM8 that calculate the first ECC information can store the first ECC information in a portion of their memory arrays (e.g., dedicated to storing ECC information).

At blocks 255 and 256 of FIG. 2B, the method 250 continues by (a) remapping the first logical address from the second physical address to the first physical address of the memory device, and (b) remapping a second logical address from a third physical address to the second physical address, respectively. In some embodiments, the remapping performed at block 255 and/or the remapping performed at block 256 can be executed in response to one or more commands to enable and/or execute an sPPR operation on the memory device. In other embodiments, the remapping performed at block 255 can be executed in response to a command to disable and/or undo the sPPR operation executed at block 251. In these and other embodiments, the third physical address can correspond to a third memory row of a memory array of the memory device. Depending on the sPPR functionality of the memory system, the remapping performed at block 256 can be omitted from the method 250 in some embodiments.

The remapping performed at block 255 and the remapping performed at block 256 are shown in FIG. 4D for the sake of example. In particular, the logical address LA2 (the first logical address) in the table 480 of FIG. 4D can be remapped at block 255 of the method 250 of FIG. 2B (e.g., as part of an sPPR operation) such that it corresponds to the physical address PA2 (the first physical address) of the first memory device DRAM0 rather than the physical address PAR (the second physical address) of the first memory device DRAM0. Thus, after the remapping performed at block 255 of FIG. 2B, the memory device DRAM0 accesses the memory row 2 of the table 370a of FIG. 3B as opposed to the redundant memory row R of the table 370a when a memory controller or a host device references the logical address LA2 of the memory device DRAM0.

Furthermore, the second logical address referenced at block 256 above can be the logical address LA0 in the table 480 of FIG. 4D, and the third physical address referenced at block 256 above can be the physical address PA0 in the table 480. In addition, the third physical address referenced at block 256 above can correspond to memory row 0 of the first memory device DRAM0 illustrated in the table 480 and in the table 370a of FIG. 3B. Thus, the physical address PA0 in the table 480 of FIG. 4D can correspond to memory row 0 in the table 370a of FIG. 3B.

Continuing with this example, the logical address LA0 (the second logical address) in the table 480 can be remapped at block 256 of the method 250 of FIG. 2B (e.g., as part of an sPPR operation) such that it corresponds to the physical address PAR (the second physical address) of the first memory device DRAM0 in the table 480 of FIG. 4D rather than the physical address PA0 (the third physical address) of the first memory device DRAM0 in the table 480. Thus, after the remapping performed at block 256 of FIG. 2B, the memory device DRAM0 accesses the redundant memory row R of the table 370a as opposed to the memory row 0 of the table 370a when a memory controller or a host device references the logical address LA0 of the memory device DRAM0.

At blocks 257 and 258 of FIG. 2B, the method 250 continues by receiving second data and writing the second data to the memory array of one or more memory devices at the first logical address. In some embodiments, the second data can be written to the memory array of only one memory device (e.g., only the memory device DRAM0 in FIGS. 3A-4F). In other embodiments, the second data can be written to the memory arrays of more than one memory device (e.g., all or a subset of the memory devices DRAM0-DRAM7 of FIGS. 3A-4F). As discussed above, the second data can correspond to first data written to the memory array(s) at block 253. In these and other embodiments, the second data can be known 'good data.' For example, the second data can include (e.g., default, normal, non-poisoned, etc.) bits data or data devoid of intentionally injected errors relative to the first data.

The receiving and writing of second data performed at blocks 257 and 258 of the method 250 is shown in FIGS. 3C and 4E. Referring to FIG. 3C, the second data can be (a) received by each of the memory devices DRAM0-DRAM7 and (b) written to the respective memory arrays of the memory devices DRAM0-DRAM7 using the logical address LA2 (the first logical address). In particular, as shown in FIG. 4E, the logical address LA2 references memory row 2 in the memory array of each of the memory devices DRAM0-DRAM7 (due at least in part to the remapping performed at block 255 of the method 250 of FIG. 2B). Thus, as shown in FIG. 3C, the memory devices DRAM1-DRAM7 overwrite the first data stored to memory row 2 of their respective memory arrays with the second data, and the memory device DRAM0 writes the second data to memory row 2 of its memory array. The table 480 in FIG. 4E has been updated to include a general indication that second data is written to memory row 2 (corresponding to physical address PA2, or the first physical address) of the first memory device DRAM0.

Similar to the first data discussed above, the second data can be received by one or more of the memory devices DRAM0-DRAM7 via one or more of their respective DQ terminals. In some embodiments, the memory devices DRAM0-DRAM7 can each receive the second data via the same or different DQ pins used to receive the first data. For example, the memory devices DRAM0-DRAM7 can each receive the second data via only the first DQ terminal DQ0. Thus, the methods 240 (FIG. 2A) and 250 (FIG. 2B) can be used to test the ECC capability of the memory devices DRAM0-DRAM7 and/or the corresponding memory system with respect to only the first DQ terminals DQ0 of the memory devices DRAM0-DRAM7. In other examples of the present technology, any combination of DQ terminals can be used to receive the second data. Thus, any combination of DQ terminals can be used to test the ECC capability of the memory devices DRAM0-DRAM7 and/or of the corresponding memory system.

As shown in FIG. 3C, the second data is a string of all "0" (e.g., logical low) data bits. As discussed above, the second data can correspond to first data written to the memory devices DRAM0-DRAM7 at block 253 of the method 250 of FIG. 2B. More specifically, referring to table 370*a* of FIG. 3C, the first data (stored to the redundant memory row R) and the second data (stored to memory row 2) differ at only column or bit 3 on the first memory device DRAM0. Thus, bit 3 of the first data on the redundant memory row R can represent a single bit fail or error (e.g., a bit inversion) that were to occur had the second data (as opposed to the first data) been written to the redundant memory row R of the first memory device DRAM0 at block 253 with an unintentional error at bit 3 of the redundant memory row R. In other words, the "1" data bit of the first data written to bit 3 of the redundant memory row R of the first memory device DRAM0 at block 253 of the method 250 (FIG. 2B) is an intentional single bit error that has been injected into the memory array of the first memory device DRAM0 at a known location (and, in some cases, via a known DQ pin, such as the first DQ pin DQ0). As discussed in greater detail below, the injection of this error at a known location of the memory array can be used to test ECC functionality of the memory device DRAM0 and/or the corresponding memory system.

Referring back to FIG. 2B, the method 250 continues at block 259 by storing second ECC information corresponding to the second data. As discussed above with respect to FIG. 1A, the second ECC information (a) can be calculated by a system-level ECC component (e.g., the ECC component 102 of FIG. 1A) and/or by one or more on-die ECC components (e.g., one or more ECC components 162 of FIG. 1B), and (b) can include parity bits or other data (e.g., single-bit error correction and double-bit error detection codes) that can be used to identify and/or correct errors (e.g., bit insertions, bit deletions, or a bit inversions/flips) in the second data. In some embodiments, the second ECC information can be stored to the same memory device(s) storing the second data. In these and other embodiments, the second ECC information can be stored to a memory device dedicated to storing ECC information. For example, second ECC information "Y" corresponding to the second data can be stored on the ninth memory device DRAM8 at memory row 2 (as shown in the table 370*i* of FIG. 3C) that corresponds to the first logical address (logical address LA2) and physical address PA2 on the ninth memory device DRAM8 (as shown in the table 480 of FIG. 4E). Thus, the memory device DRAM8 can overwrite the first ECC information "X" that was stored to memory row 2 of the memory device DRAM8 at block 254 of the method 250 of FIG. 2B with the second ECC information "Y."

In some embodiments, the second ECC information can be (a) calculated by a system-level ECC component and/or (b) received by one or more of the memory devices DRAM0-DRAM8 before, during, or after one or more of the memory devices DRAM0-DRAM8 receive the second data. In these and other embodiments, one or more of the memory devices DRAM0-DRAM8 can receive the second data and can use one or more on-die ECC components to calculate the second ECC information based at least in part on the second data. The memory devices DRAM0-DRAM8 that calculate the second ECC information can then store the second ECC information in a portion of their memory arrays (e.g., dedicated to storing ECC information).

At blocks 260 and 261 of FIG. 2B, the method 250 continues by (a) remapping the second logical address from the second physical address to the third physical address of the memory device, and (b) remapping the first logical address from the first physical address to the second physical address. In some embodiments, the remapping performed at block 260 and/or the remapping performed at block 261 can be executed in response to one or more commands to enable and/or execute an sPPR operation on the memory device. In other embodiments, the remapping performed at block 260 can be executed in response to a command to disable and/or undo the sPPR operation executed at block 256. Depending on the sPPR functionality of the memory system, the remapping performed at block 260 can be omitted from the method 250 in some embodiments.

The remapping performed at block 260 and the remapping performed at block 261 are shown in FIG. 4F for the sake of example. In particular, the logical address LA0 (the second logical address) in the table 480 can be remapped at block 260 of the method 250 of FIG. 2B (e.g., as part of an sPPR operation) such that it corresponds to the physical address PA0 (the third physical address) of the first memory device DRAM0 rather than the physical address PAR (the second physical address) of the first memory device DRAM0. Thus, after the remapping performed at block 260 of FIG. 2B, the memory device DRAM0 accesses the memory row 0 of the table 370*a* of FIG. 3C as opposed to the redundant memory row R of the table 370*a* when a memory controller or a host device references the logical address LA0 of the memory device DRAM0.

Furthermore, the logical address LA2 (the first logical address) in the table 480 of FIG. 4F can be remapped at block 261 of the method 250 of FIG. 2B (e.g., as part of an sPPR operation) such that it corresponds to the physical address PAR (the second physical address) of the first memory device DRAM0 in the table 480 rather than the physical address PA2 (the first physical address) of the first memory device DRAM0 in the table 480. Thus, after the remapping performed at block 261 of FIG. 2B, the memory device DRAM0 accesses the redundant memory row R of the table 370a of FIG. 3C as opposed to the memory row 2 of the table 370a when a memory controller or a host device references the logical address LA2 of the memory device DRAM0. Similar to block 251 of the method 250 of FIG. 2B discussed above, the discussion below assumes that the logical address LA2 has been remapped to the second physical address at block 261 for only the first memory device DRAM0. Thus, when the memory controller or the host device references the logical address LA2 of the other memory devices DRAM1-DRAM8, the memory devices DRAM1-DRAM8 continue to access the first physical address corresponding to memory row 2 of their respective memory arrays.

At blocks 262 and 263 of FIG. 2B, the method 250 continues by using the first logical address to read the first data and the second ECC information. In some embodiments, reading the first data and/or the second ECC information can include outputting the first data and/or the second ECC information from one or more memory devices (e.g., to a memory controller and/or a host device). In these and other embodiments, reading the first data and/or the second ECC information can include reading the first data and/or the second ECC information in response to a receiving a command to read data from the memory devices at the first logical address.

For example, as shown in FIG. 4F, the first logical address (the logical address LA2) was remapped to the second physical address (the physical address PAR) at block 261 of the method 250 of FIG. 2B. Thus, as shown in FIGS. 3C and 4F, when the first memory device DRAM0 receives a command to read out data stored to the first logical address (the logical address LA2), the first memory device DRAM0 accesses the redundant memory row R and outputs the first data because the first logical address (the logical address LA2) corresponds to the second physical address (the physical address PAR). In addition, as shown in FIG. 3C, when the other memory devices DRAM1-DRAM7 receive a command to read out data stored to the first logical address (the logical address LA2), the other memory devices DRAM1-DRAM7 output the second data stored to memory row 2. In embodiments in which the portions of the first data stored to the other memory devices DRAM1-DRAM7 at block 253 of the method 250 of FIG. 2B are identical to the portions of the second data stored to the other memory device DRAM1-DRAM7 at block 258 of the method 250, the other memory devices DRAM1-DRAM7 can effectively output the portions of the first data that was stored to memory row 2 at block 253 of the method 250 in response to a command to output the data stored to the first logical address (the logical address LA2) even though these memory devices DRAM1-DRAM7 are actually outputting the portions of the second data stored to memory row 2 at block 258 of the method 250. Continuing with the above example with reference to FIGS. 3C and 4F, when the ninth memory device DRAM8 receives a command to read out data stored to the first logical address (the logical address LA2), the ninth memory device DRAM8 outputs the second ECC information "Y" stored to memory row 2 and corresponding to the second data.

Thus, when the memory devices DRAM0-DRAM8 receive a command to read out data stored at the first logical address (the logical address LA2), the memory devices DRAM0 reads out a portion of the first data that includes an intentionally injected error relative to the second data, the memory devices DRAM0-DRAM7 read out portions of the second data that (in example provided in FIGS. 3A-4F) are devoid of intentionally-injected errors and are identical to corresponding portions of the first data, and the ninth memory device DRAM8 reads out the second ECC information "Y" that corresponds to the second data. (In the discussion of blocks 242-248 of the method 240 of FIG. 2A below, the portion of the first data output from the memory device DRAM0 and the portions of the second data output from the other memory devices DRAM1-DRAM7 at blocks 262 and 263 of the method 250 of FIG. 2B are referred to collectively as "first data".) As discussed in greater detail below, the method 250 of FIG. 2B can therefore be employed to test the ECC capability of the memory devices DRAM0-DRAM8 and/or of the corresponding memory system. In other words, the method 250 can be used to determine whether the on-die ECC component(s) and/or the system-level ECC component(s) can utilize the second ECC information "Y" to identify and/or correct the intentionally-injected error in the portion of the first data output from the first memory device DRAM0.

Although the blocks 251-263 of the method 250 are discussed and illustrated in a particular order, the method 250 illustrated in FIG. 2B is not so limited. In other embodiments, the method 250 can be performed in a different order. In these and other embodiments, any of the blocks 251-263 of the method 250 can be performed before, during, and/or after any of the other blocks 251-263 of the method 250. Moreover, a person of ordinary skill in the relevant art will recognize that the illustrated method 250 can be altered and still remain within these and other embodiments of the present technology. For example, one or more blocks 251-263 of the method 250 illustrated in FIG. 2B can be omitted and/or repeated in some embodiments. As a specific example, blocks 251, 254, 256, 260, 262, and/or 263 of the method 250 can be omitted in some embodiments.

Referring back to FIG. 2A, once data stored to the memory array(s) of the memory system has been poisoned at block 241 (e.g., using the method 250 of FIG. 2B), the method 240 continues at block 242 by receiving (e.g., a portion of) the first data and the second ECC information. As discussed above, the first data can include at least one intentionally-injected error relative to the second data that lacks the intentionally-injected error. In addition, the second ECC information can be calculated (e.g., by one or more on-die ECC component(s) and/or by a system-level ECC component) based at least in part on the second data. In some embodiments, receiving the first data and the second ECC information can include receiving the first data and the second ECC information in response to one or more commands to read the first data and the second ECC information from one or more memory devices.

At blocks 243 and 244, the method 240 continues by processing the first data using the second ECC information and determining whether one or more errors are detected in the first data. As discussed above with respect to FIGS. 1A and 1B, processing the first data using the second ECC information can include (a) separately calculating or generating ECC information based at least in part on the first data, and (b) comparing the separately calculated ECC information to the second ECC information. If the separately calculated ECC information matches the second ECC information, the method 240 can determine that no errors in the first data were detected (block 244: No), and the method can proceed to block 245. On the other hand, if the separately calculated ECC information does not match the second ECC information, the method 240 can determine that at least one error in the first data was detected (block 244: Yes), and the method 240 can proceed to block 246.

At block 245, the method 240 continues by outputting an error message. In some embodiments, the error message can be an indication that no errors were detected at block 244. For example, the error message can be an outputting of the first data (e.g., to a memory controller and/or a host device). In particular, because the second ECC information corresponds to second data that lacks an intentionally-injected error, the second ECC information should not match the separately calculated ECC information that was calculated at block 243 based on the first data that includes the intentionally-injected error. Thus, if the separately calculated ECC information corresponding to the first data matches the second ECC information that corresponds to the second data, the method 240 can determine that no errors are present in the first data and can proceed to output the first data as an error message. The outputting of the first data can be an indication that (a) the second ECC information corresponding to the second data was calculated incorrectly, (b) the separately calculated ECC information corresponding to the first data was calculated incorrectly, and/or (c) the comparison operation of the second ECC information to the separately calculated ECC information was not executed correctly. In any event, outputting of the error message at block 245 can indicate that the ECC component(s) of the memory system are not operating correctly.

At block 246, the method 240 can continue by performing one or more ECC correction operations on the first data. In some embodiments, performing the ECC correction operation(s) on the first data includes correcting one or more of the intentionally-injected error(s) in the first data and identified at blocks 243 and 244. In these and other embodiments, performing the ECC correction operation(s) on the first data includes correcting one or more of the intentionally-injected error(s) in the first data using or based on the separately calculated ECC information from block 243 and/or the second ECC information.

At block 247, the method 240 continues by determining whether the ECC correction operation(s) performed at block 247 corrected the intentionally-injected error(s) in the first data. If the method 240 determines that all or a subset of the errors were not corrected at block 246 (block 247: No), the method 240 can proceed to block 245 to output an error message. On the other hand, if the method 240 determines that the error(s) were corrected at block 246 (block 247: Yes), the method 240 can proceed to block 248.

When the method 240 proceeds to block 245 from block 247, the method 240 can output an error message. In some embodiments, the error message can be output to a memory controller and/or a host device. In these and other embodiments, the error message can be the first data (indicating that none of the intentionally-injected errors in the first data were corrected at block 246) or third data (indicating that some but not all of the intentionally-injected errors in the first data were corrected at block 246). In these and still other embodiments, the error message can be an indication that the errors detected at blocks 243 and 244 exceed the ECC correction capability of the memory device and/or the memory system. In any of these events, the method 240 proceeding to block 245 from block 247 can indicate that the ECC components are not operating correctly and/or that the ECC correction operations are not being executed correctly.

At block 248, the method 240 can continue by outputting a success message. In some embodiments, the success message can be an indication all of the intentionally-injected errors in the first data were detected at block 244 and/or corrected at block 246. For example, the success message can be an outputting of data identical to the second data (e.g., to a memory controller and/or a host device). In particular, because the second ECC information corresponds to second data that lacks an intentionally-injected error, the second data (or data identical to the second data) should be output at block 248 only when the intentionally-injected errors are cleared from the first data such that the result of the ECC correction performed at block 246 is effectively the second data. Such an output of the method 240 can be an indication that (a) the second ECC information corresponding to the second data was calculated correctly, (b) the separately calculated ECC information corresponding to the first data was calculated correctly, (c) the comparison operation of the second ECC information to the separately calculated ECC information was executed correctly, and/or (d) the ECC correction operation(s) were executed correctly. In other words, outputting of the success message at block 248 of the method 240 can indicate that the ECC component(s) of the memory system are operating correctly.

Although the blocks 241-248 of the method 240 are discussed and illustrated in a particular order, the method 240 illustrated in FIG. 2A is not so limited. In other embodiments, the method 240 can be performed in a different order. In these and other embodiments, any of the blocks 241-248 of the method 240 can be performed before, during, and/or after any of the other blocks 241-248 of the method 240. Moreover, a person of ordinary skill in the relevant art will recognize that the illustrated method 240 can be altered and still remain within these and other embodiments of the present technology. For example, one or more blocks 241-248 of the method 240 illustrated in FIG. 2A can be omitted and/or repeated in some embodiments. As a specific example, blocks 246-248 of the method 240 can be omitted in some embodiments, such as in embodiments in which the intentionally-injected error(s) in the first data are beyond the ECC correction capability of the memory device and/or the memory system. More specifically, the ECC information can include single-bit error correction and double-bit error detection codes. In these embodiments, the method 240 can proceed to block 248 when the method 240 (a) detects two intentionally-injected errors in the first data regardless of whether the method 240 is able to correct one or both of the intentionally-injected error, or (b) detects and corrects a single bit fail that was intentionally-injected into the first data.

FIGS. 2A-4F were primarily discussed above in the context of writing first data to a single memory row of a memory device that emulates a single bit error, single wordline driver error, or other device defects. Aspects of the present technology discussed above, however, can be extended and employed to emulate different error types (double bit errors, single wordline driver errors, etc.) or device defects and/or to test RAS or ECC capability in other contexts. For example, the first data received and written at blocks 252 and 253 of FIG. 2B above can include two bits (e.g., bit 3 and bit 7) that are "1" (e.g., logical high) data bits to emulate a double bit error with respect to the second data received and written at blocks 257 and 258 of FIG. 2B. In some embodiments, more than two bits of the first data can be "1" (e.g., logical high) data bits to emulate more than two bit errors with respect to the second data. In these and other embodiments, the "1" (e.g., logical high) data bits can be received via only one of the DQ terminals (e.g., the DQ terminal DQ0) or via multiple ones of the DQ terminals.

Thus, the RAS or ECC capability of the memory device or system can be tested across only one or multiple DQ terminals.

As another example, the first data can be written to a first memory row of the memory device and third data can be written to another memory row of the memory device. The third data can include one or more bits that are "1" (e.g., logical high) data bits to emulate one or more bit errors with respect to the second data. The "1" (e.g., logical high) data bits in the third data can be included at the same or different bit locations (columns) as the "1" (e.g., logical high) data bit in the first data. Thus, continuing with this example, the RAS or ECC capability of the memory device or system can be tested across multiple memory rows.

As still another example, one or more intentionally-injected errors can be written to one or more memory rows of more than one memory device. For example, the portion of the first data written to the first memory device DRAM0 and shown in FIG. 3B can be written to one or more of the other memory devices DRAM1-DRAM7. Thus, continuing with this example, the RAS or ECC capability of the memory devices or the memory system can be tested across multiple memory devices of a memory system.

In some embodiments, the RAS or ECC capability of a single memory device can be tested (in addition to or in lieu of testing the RAS or ECC capability of a memory system). For example, a memory device can receive or generate first data including one or more intentionally-injected errors. The memory device can (a) calculate first ECC information using one or more on-die ECC components and based at least in part on the first data, and/or (b) store the first data and/or the first ECC information to its memory array (e.g., after executing a first sPPR operation). Continuing with this example, the memory device can receive or generate second data corresponding to the first data. The memory device can (a) calculate second ECC information using one or more on-die ECC components and based at least in part on the second data, and (b) store the second data and/or the second ECC information to its memory array (e.g., after executing a second sPPR operation). The memory device can then (a) read the first data and the second ECC information from the memory array (e.g., after performing a third sPPr operation) and (b) check the RAS or ECC capability of the on-die ECC component(s) in accordance with the discussion of FIG. 2A above, including comparing the second ECC information to newly calculated ECC information generated by the on-die ECC component(s) based at least in part on the first data read from the memory array.

As another example, a memory device can receive (a) first data including one or more intentionally-injected errors and (b) second ECC information calculated or generated (e.g., by one or more system-level ECC components) based at least in part on second data that corresponds to the first data. In turn, one or more on-die components of the memory device can calculate or generate first ECC information based at least in part on the first data. The memory device can then check the RAS or ECC capability of the on-die ECC component(s) in accordance with the discussion of FIG. 2A above, including comparing the first ECC information to the second ECC information to detect and/or correct one or more of the intentionally-injected errors in the first data.

As still another example, a memory controller or host device can receive (a) first data including one or more intentionally-injected errors and (b) second ECC information calculated or generated (e.g., by one or more on-die ECC components) based at least in part on second data that corresponds to the first data. In turn, one or more system-level components of the memory controller or host device can calculate or generate first ECC information based at least in part on the first data. The memory controller or the host device can then check the RAS or ECC capability of the system-level ECC component(s) in accordance with the discussion of FIG. 2A above, including comparing the first ECC information to the second ECC information to detect and/or correct one or more of the intentionally-injected errors in the first data.

Figure 5:
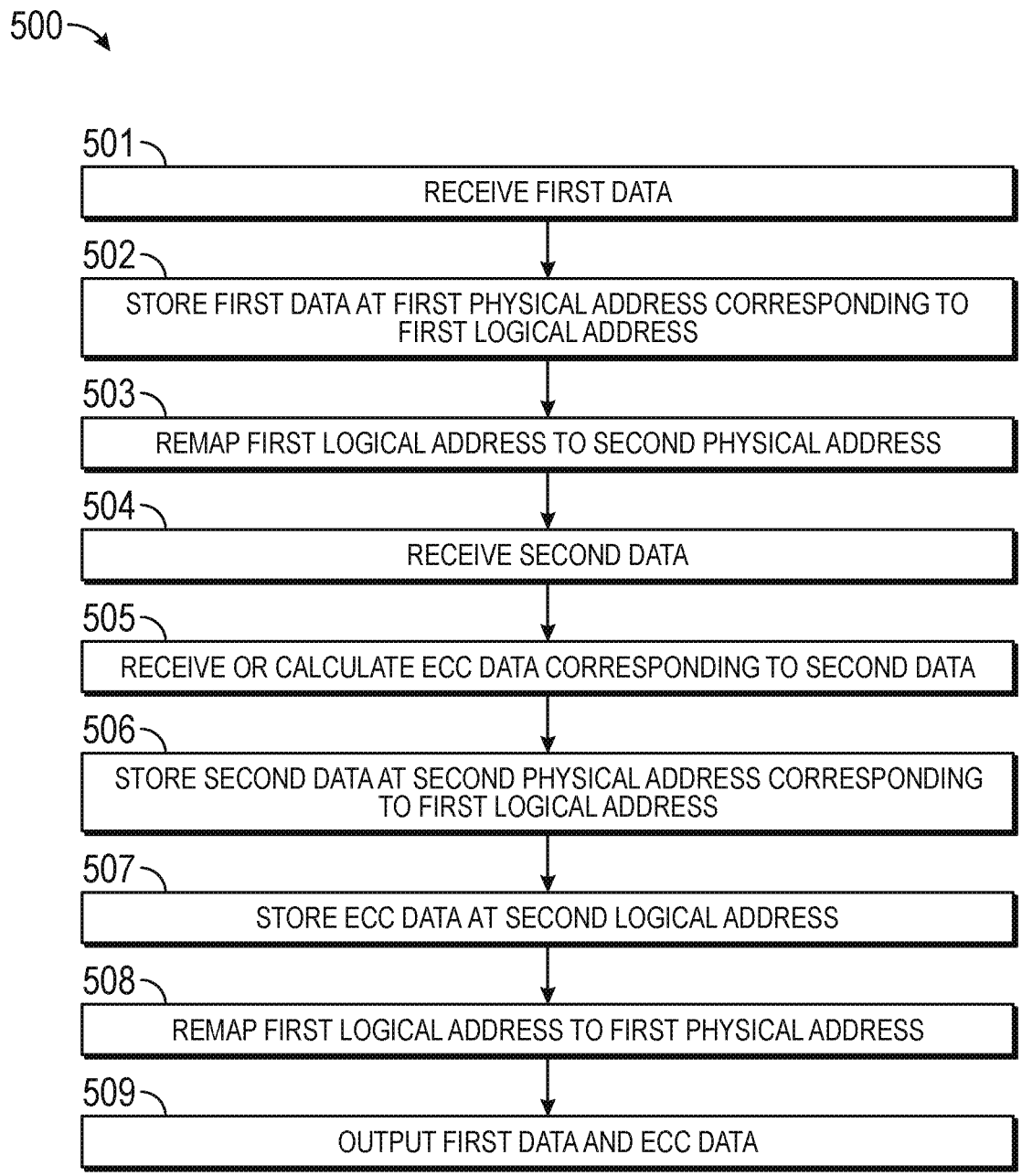
FIG. 5 is a flow diagram illustrating a method of injecting data into a memory array in accordance with various embodiments of the present technology.

FIG. 5 is a flow diagram illustrating a method 500 of injecting data into a memory array in accordance with various embodiments of the present technology. The method 500 is illustrated as a set of steps or blocks 501-509. All or a subset of one or more of the blocks 501-509 can be executed by components or devices of a memory system, such as the memory system 190 of FIG. 1A. For example, all or a subset of one or more of the blocks 501-509 can be executed by (i) one or more memory devices (e.g., one or more of the memory devices 100 of FIGS. 1A and 1B), (ii) a memory controller (e.g., the memory controller 101 of FIG. 1A), and/or (iii) a host device (e.g., the host device 108 of FIG. 1A). Furthermore, any one or more of the blocks 501-509 can be executed in accordance with the discussion of FIGS. 1A-4F above.

The method 500 begins at block 501 by receiving first data to be written at a first logical address. In some embodiments, the first data can be received after enabling a sPPR function. In these and other embodiments, the first data can be 'known bad' data that is injected with one or more errors. The one or more errors can include a bit insertion, a bit deletion, or a bit inversion. In these and still other embodiments, the first data can be data to be written at a first logical address of a first memory device or a first group of memory devices.

At block 502, the method 500 continues by storing the first data at a first physical address corresponding to the first logical address. In some embodiments, the first physical address corresponds to a first memory row or region of a memory array of the first memory device or to a first memory row or region of a memory array of each memory device of the first group of memory devices. The first memory row or region can be a memory row or region normally used for access (e.g., read or write) operations or a redundant memory row or region (e.g., dedicated or reserved for sPPR operations).

At block 503, the method 500 continues by remapping the first logical address to a second physical address. In some embodiments, the remapping can include performing a first sPPR operation. Performing the first sPPR operation can include executing the first sPPR operation in response to a first command to perform the first sPPR operation. In these and other embodiments, the second physical address corresponds to a second memory row or region of a memory array of the first memory device or to a second memory row or region of a memory array of each memory device of the first group of memory devices. The second memory row or region can be a memory row or region normally used for access (e.g., read or write) operations or a redundant memory row or region (e.g., dedicated or reserved for sPPR operations).

At block 504, the method 500 continues by receiving second data to be written at the first logical address. In some embodiments, the second data can be different from the first data. In these and other embodiments, the second data can be 'known good' data that is devoid of injected errors. In these and still other embodiments, the second data can correspond to the first data. For example, the first data can be the second data injected with one or more errors. In these and still other embodiments, the second data can be data to be written at the first logical address of the first memory device or the first group of memory devices.

At block 505, the method 500 continues by receiving or calculating ECC data corresponding to the second data. In some embodiments, the ECC data can be calculated using a system-level ECC component (e.g., of a memory controller and/or of a host device) and/or an on-die ECC component (e.g., of one or more memory devices). In these and other embodiments, the ECC data can include parity bits or other data (e.g., single-bit error correction and double-bit error detection codes) that can be used to identify and/or correct errors in the second data.

At blocks 506 and 507, the method 500 continues by storing the second data at the second physical address corresponding to the first logical address, and storing the ECC data at a second logical address. Storing the ECC data at the second logical address can include storing the ECC data at the second logical address of a same memory device or group of memory devices to which the first and/or the second data is stored (e.g., the first memory device or the first group of memory devices). Alternatively, storing the ECC data can include storing the ECC data at the second logical address of a second memory device or a second group of memory devices different from the first memory device and/or the first group of memory devices. In some embodiments, the first logical address and the second logical address can correspond to a same logical address in each of (a) the first memory device or the first group of memory devices and (b) the second memory device or the second group of memory devices.

At block 508, the method 500 continues by remapping the first logical address to the first physical address. In some embodiments, the remapping can include performing a second sPPR operation. Performing the second sPPR operation can include executing the second sPPR operation in response to a second command to perform the second sPPR operation.

At block 509, the method 500 continues by outputting the first data and/or the ECC data. In some embodiments, the method 500 outputs the first data in response to a command or request to read out data from the first logical address. In these and other embodiments, outputting the first data can include outputting the first data from the first physical address corresponding to the first logical address. In these and still other embodiments, outputting the first data can include outputting the first data in lieu of the second data. In some embodiments, the method 500 outputs the ECC data in response to a command or request to read out data from the second logical address. The command to read out data from the second logical address can be the same or a different command to read out data from the first logical address.

Although the blocks 501-509 of the method 500 are discussed and illustrated in a particular order, the method 500 illustrated in FIG. 5 is not so limited. In other embodiments, the method 500 can be performed in a different order. In these and other embodiments, any of the blocks 501-509 of the method 500 can be performed before, during, and/or after any of the other blocks 501-509 of the method 500. Moreover, a person of ordinary skill in the relevant art will recognize that the illustrated method 500 can be altered and still remain within these and other embodiments of the present technology. For example, one or more blocks 501-509 of the method 500 illustrated in FIG. 5 can be omitted and/or repeated in some embodiments. As a specific example, block 509 of the method 500 can be omitted in some embodiments.

Figure 6:
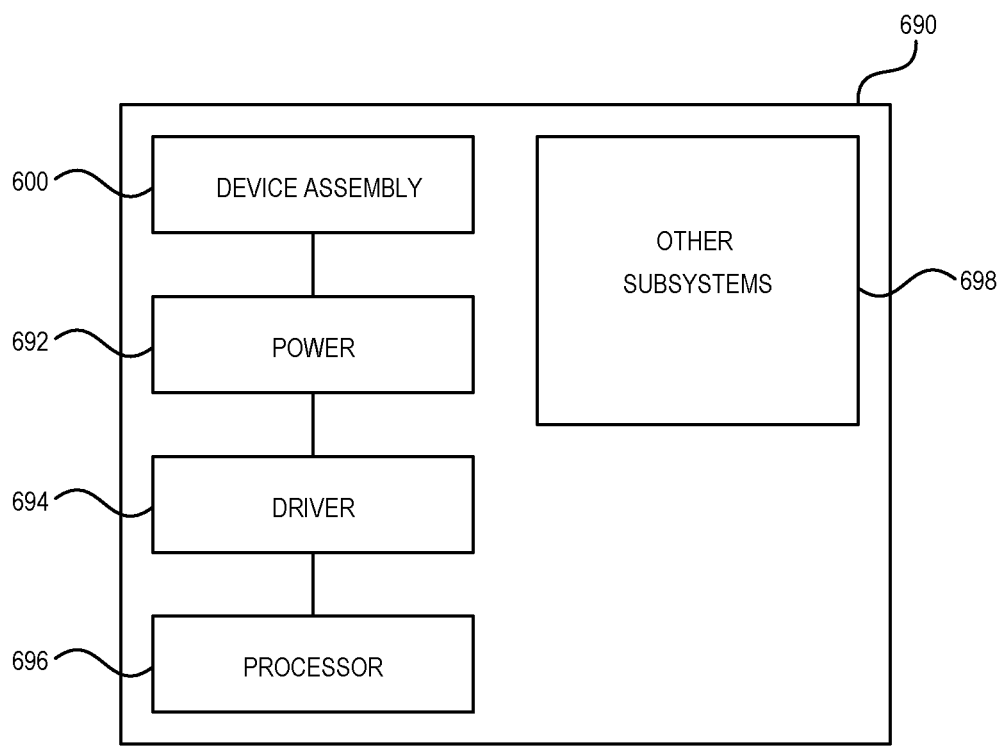
FIG. 6 is a block diagram of a system having a memory device configured in accordance with embodiments of the present technology.

Any of the foregoing memory systems, devices, and/or methods described above with reference to FIGS. 1A-5 can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems and components 698. The semiconductor device assembly 600 can include features generally similar to those of the memory systems, devices, and/or methods described above with reference to FIGS. 1A-5. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

C. Conclusion

As used herein, the terms "memory system" and "memory device" refer to systems and devices configured to temporarily and/or permanently store information related to various electronic devices. Accordingly, the term "memory device" can refer to a single memory die and/or to a memory package containing one or more memory dies. Similarly, the term "memory system" can refer to a system including one or more memory dies (e.g., a memory package) and/or to a system (e.g., a dual in-line memory module (DIMM)) including one or more memory packages.

Where the context permits, singular or plural terms can also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded. Moreover, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein. To the extent any materials incorporated herein by reference conflict with the present disclosure, the present disclosure controls.

What is claimed is:

1. A method, comprising:
receiving first data to be written at a logical address;
storing the first data at a first physical address corresponding to the logical address;
after storing the first data and prior to reading the first data, remapping the logical address to a second physical address;
receiving second data different from the first data to be written at the logical address;
storing the second data at the second physical address;
after storing the second data, remapping the logical address to the first physical address; and
after storing the second data and remapping the logical address to the first physical address, outputting the first data from the first physical address, in response to a read request corresponding to the logical address.

2. The method of claim 1, wherein the first data corresponds to the second data with one or more errors intentionally injected.

3. The method of claim 2, wherein the one or more errors comprise a bit insertion, a bit deletion, or a bit inversion.

4. The method of claim 1, further comprising enabling a soft post-package repair (sPPR) function prior to receiving the first data.

5. The method of claim 1, wherein remapping the logical address to the second physical address comprises performing soft post-package repair (sPPR).

6. The method of claim 1, wherein remapping the logical address to the first physical address comprises performing soft post-package repair (sPPR).

7. The method of claim 1, wherein the first physical address and the second physical address correspond to first and second rows, respectively, of a memory array.

8. The method of claim 1, further comprising, in response to the read request corresponding to the logical address, outputting ECC data in addition to the first data, wherein the ECC data corresponds to the second data.

9. An apparatus, comprising:
a memory array comprising a plurality of rows; and
circuitry configured to:
in response to a command to write first data at a logical address, write the first data to a first physical address corresponding to the logical address;
after writing the first data and prior to reading the first data, remap the logical address to a second physical address;
in response to a command to write second data different from the first data at the logical address, write the second data to the second physical address;
after writing the second data, remap the logical address to the first physical address; and
after writing the second data and remapping the logical address to the first physical address, output the first data from the first physical address in response to a read request corresponding to the logical address.

10. The apparatus of claim 9, wherein the first data corresponds to the second data with one or more errors intentionally injected.

11. The apparatus of claim 10, wherein the one or more errors comprise a bit insertion, a bit deletion, or a bit inversion.

12. The apparatus of claim 10, wherein the circuitry is further configured to enable a soft post-package repair (sPPR) function prior to receiving the first data.

13. The apparatus of claim 10, wherein the circuitry is configured to remap the logical address to the second physical address by performing soft post-package repair (sPPR).

14. The apparatus of claim 10, wherein the circuitry is configured to remap the logical address to the first physical address by performing soft post-package repair (sPPR).

15. The apparatus of claim 10, wherein the first physical address and the second physical address correspond to first and second rows, respectively, of a memory array.

16. The apparatus of claim 9, wherein the circuitry is further configured to, in response to the read request corresponding to the logical address, output ECC data in addition to the first data, wherein the ECC data corresponds to the second data.

17. A method of operating a memory system including a first memory device and a second memory device, the method comprising:
writing first user data to a first logical address of the first memory device, wherein the first logical address corresponds to a first physical address of the first memory device;

after writing the first user data and prior to reading the first user data, remapping the first logical address to a second physical address of the first memory device;
calculating ECC data corresponding to second user data;
writing the second user data to the first logical address of the first memory device and writing the ECC data to a second logical address of the second memory device;
after writing the second user data, remapping the first logical address to the first physical address of the first memory device; and
after writing the second user data and remapping the first logical address to the first physical address of the first memory device, and in response to a read request targeting the first logical address of the first memory device and the second logical address of the second memory device, outputting the first user data from the first physical address of the first memory device and outputting the ECC data from the second logical address of the second memory device.

18. The method of claim 17, wherein the first physical address and the second physical address correspond to first and second rows, respectively, of a memory array.

19. The method of claim 17, wherein the first user data corresponds to the second user data with one or more errors intentionally injected.

20. The method of claim 17, wherein remapping the first logical address to the second physical address comprises performing soft post-package repair (sPPR).

21. The method of claim 17, wherein remapping the first logical address to the first physical address comprises performing soft post-package repair (sPPR).

22. The method of claim 17, wherein the first physical address corresponds to a first row of the first memory device and the second physical address corresponds to a second row of the first memory device.

23. The method of claim 22, wherein one of the first row and the second row is a redundant row dedicated to a soft post-package repair (sPPR) operation.

24. The method of claim 17, wherein the first logical address and the second logical address correspond to a same logical address in each of the first and second memory devices.

25. The method of claim 17, wherein calculating the ECC data is performed by a host device of the memory system.

26. The method of claim 17, further comprising characterizing and/or testing an error correction capability of the memory system based on a mismatch between the first user data and the ECC data.

* * * * *